(12) United States Patent
Chen et al.

(10) Patent No.: US 10,439,372 B2
(45) Date of Patent: Oct. 8, 2019

(54) CONTAINER ENERGY STORAGE SYSTEM

(71) Applicant: Delta Electronics, Inc., Taoyuan (TW)

(72) Inventors: Chin-Ming Chen, Taoyuan (TW); Mu-Min Lin, Taoyuan (TW)

(73) Assignee: Delta Electronics, Taoyuan (TW)

( * ) Notice: Subject to any disclaimer, the term of this patent is extended or adjusted under 35 U.S.C. 154(b) by 0 days.

(21) Appl. No.: 15/945,213

(22) Filed: Apr. 4, 2018

(65) Prior Publication Data

US 2018/0226774 A1 Aug. 9, 2018

Related U.S. Application Data

(63) Continuation of application No. 15/298,655, filed on Oct. 20, 2016, now Pat. No. 9,966,739.

(30) Foreign Application Priority Data

Feb. 24, 2016 (TW) .............................. 105105381 A

(51) Int. Cl.
| | | |
|---|---|---|
| *H05K 7/14* | (2006.01) | |
| *H02B 1/34* | (2006.01) | |
| *A47B 53/00* | (2006.01) | |
| *B65D 90/00* | (2006.01) | |
| *H02B 1/20* | (2006.01) | |

(Continued)

(52) U.S. Cl.
CPC ............... *H02B 1/34* (2013.01); *A47B 53/00* (2013.01); *B65D 90/0046* (2013.01); *B65D 90/0053* (2013.01); *E04H 5/00* (2013.01); *E04H 5/04* (2013.01); *H01M 2/10* (2013.01); *H01M 2/1077* (2013.01); *H01M 2/206* (2013.01); *H02B 1/20* (2013.01); *H02B 1/28* (2013.01); *H02B 1/30* (2013.01); *H02B 1/306* (2013.01); *H05K 7/1432* (2013.01); *H05K 7/1497* (2013.01); *B65D 90/0073* (2013.01); *H01M 2220/10* (2013.01)

(58) Field of Classification Search
CPC ................... H05K 7/1497; H05K 7/18; B65D 2519/00–00736; B65D 90/004–0073; A47B 53/00
See application file for complete search history.

(56) References Cited

U.S. PATENT DOCUMENTS

| | | |
|---|---|---|
| 3,963,290 A | 6/1976 | Rennemann |
| 4,639,005 A | 1/1987 | Birkley |

(Continued)

FOREIGN PATENT DOCUMENTS

| | | | | |
|---|---|---|---|---|
| GB | 2518843 A | | 4/2015 | |
| GB | 2564411 A | * | 1/2019 | ............. B65D 90/00 |

(Continued)

*Primary Examiner* — Robert J Hoffberg
(74) *Attorney, Agent, or Firm* — Muncy, Geissler, Olds & Lowe, P.C.

(57) ABSTRACT

A container energy storage system is provided, including a container, a plurality of functional assemblies, and a splitting plate, wherein the splitting plate has a connecting port electrically connected to the functional assemblies. The container includes a hollow main body having an opening and two doors pivotally connected to the hollow main body. The functional assemblies are disposed in the hollow main body, and the splitting plate is disposed between the functional assemblies and the opening. When the doors are in a closed position, the doors cover the opening.

19 Claims, 9 Drawing Sheets

(51) Int. Cl.
  *H02B 1/28* (2006.01)
  *H02B 1/30* (2006.01)
  *E04H 5/00* (2006.01)
  *H01M 2/10* (2006.01)
  *H01M 2/20* (2006.01)
  *E04H 5/04* (2006.01)

(56) References Cited

U.S. PATENT DOCUMENTS

| | | | |
|---|---|---|---|
| 4,951,823 A | 8/1990 | Butkus et al. | |
| 7,025,548 B2* | 4/2006 | Krawczyk | B60P 3/055 410/66 |
| 7,192,237 B2* | 3/2007 | Strohfus | B60P 3/055 280/79.11 |
| 7,738,251 B2 | 6/2010 | Clidaras et al. | |
| 7,873,542 B2* | 1/2011 | Strohfus | B60P 3/055 705/22 |
| 7,944,692 B2* | 5/2011 | Grantham | H05K 7/20745 361/688 |
| 8,047,904 B2 | 11/2011 | Yates et al. | |
| 8,218,322 B2 | 7/2012 | Clidaras et al. | |
| 8,405,982 B2* | 3/2013 | Grantham | H05K 7/20745 361/688 |
| 8,613,364 B2 | 12/2013 | Bailey et al. | |
| 8,743,543 B2 | 6/2014 | Clidaras et al. | |
| 8,912,758 B2* | 12/2014 | Kang | H02J 7/0042 320/120 |
| 8,947,879 B2 | 2/2015 | Broome et al. | |
| 9,038,838 B2 | 5/2015 | Skeid | |
| 9,101,210 B2* | 8/2015 | Lin | F16M 1/00 |
| 9,144,176 B2 | 9/2015 | Bailey et al. | |
| 9,828,172 B2 | 11/2017 | Skeid | |
| 9,859,592 B2* | 1/2018 | Tamakoshi | H01M 10/3909 |
| 9,966,739 B2* | 5/2018 | Chen | E04H 5/00 |
| 2009/0007823 A1 | 1/2009 | Yu | |
| 2009/0229194 A1 | 9/2009 | Armillas | |
| 2010/0091449 A1 | 4/2010 | Clidaras et al. | |
| 2013/0032310 A1 | 2/2013 | Jaena et al. | |
| 2014/0185209 A1 | 7/2014 | Lee | |
| 2014/0190964 A1* | 7/2014 | Skeid | B65D 88/528 220/1.5 |
| 2017/0210555 A1 | 7/2017 | Steinert et al. | |

FOREIGN PATENT DOCUMENTS

| | | |
|---|---|---|
| JP | 3104190 U | 6/2004 |
| JP | 2012053747 A | 3/2012 |
| JP | 2012072999 A | 4/2012 |
| JP | 2013131416 A | 7/2013 |
| JP | 2014522629 A | 9/2014 |
| TW | 201144997 A | 12/2011 |
| TW | 201318935 A | 5/2013 |
| WO | WO2013111426 A1 | 8/2013 |
| WO | WO2015186343 A1 | 12/2015 |

* cited by examiner

CONTAINER ENERGY STORAGE SYSTEM

CROSS REFERENCE TO RELATED APPLICATIONS

This application is a Continuation of application Ser. No. 15/298,655, filed on Oct. 20, 2016, which claims the benefit of Taiwan Patent Application No. 105105381, filed on Feb. 24, 2016.

BACKGROUND OF THE INVENTION

Field of the Invention

The application relates in general to a container energy storage system, and in particular, to a container energy storage system having a splitting plate.

Description of the Related Art

Generally, a container energy storage system comprises a container, a plurality of energy storage members, and at least one system controller, wherein the energy storage members and the system controller are disposed in a container. Moreover, a passage is also provided in the container for moving, entering and leaving. The user can move to the aforementioned energy storage members or the system controller along the passage to operate, maintain or replace.

However, in order to dispose the energy storage members, the system controller and the passage into the container and configure the wires of the energy storage members and the system controller, a plurality of holes should be formed on the container. Therefore, the wall of the container may be broken when forming the holes, and the water resistance of the container may be reduced. Water and foreign matter may enter the interior of the container during transportation and damage the energy storage members and the system controller.

BRIEF SUMMARY OF INVENTION

To address the deficiencies of conventional products, an embodiment of the invention provides a container energy storage system, including a container, a plurality of functional assemblies, and a splitting plate, wherein the splitting plate has a connecting port electrically connected to the functional assemblies. The container includes a hollow main body having an opening and two doors pivotally connected to the hollow main body. The functional assemblies are disposed in the hollow main body, and the splitting plate is disposed between the functional assemblies and the opening. When the doors are in a closed position, the doors cover the opening.

In some embodiments, the hollow main body has a cross section, and the dimensions of the cross section are substantially the same as that of the splitting plate.

In some embodiments, the splitting plate comprises a water-resistant material.

In some embodiments, the container energy storage system further comprises a waterproof tape disposed between the splitting plate and an inner surface of the hollow main body.

In some embodiments, when the doors are in the closed position, the splitting plate is substantially parallel to the doors.

In some embodiments, the functional assemblies are parallel to each other.

In some embodiments, the functional assemblies are parallel to the splitting plate. In some embodiments, the splitting plate has an entrance, and at least a part of the functional assemblies forms a passage, wherein the passage is aligned with the entrance.

In some embodiments, the splitting plate has a board and a hatch. The entrance is formed on the board, and the hatch is pivotally connected to the board to close the entrance.

In some embodiments, at least a part of the functional assemblies comprises a first rack and a second rack, and the passage is formed between the first rack and second rack.

In some embodiments, each of the functional assemblies further comprises a fixing mechanism, comprising a first nut, a second nut, a pole having screw thread, and a contacting member connected to an end of the pole. The pole pass through the first nut, a side wall of the functional assembly, and the second nut to be fixed on the functional assembly, wherein the side wall is situated between the first nut and the second nut. When the functional assembly is fixed in the hollow main body, the contacting member contacts the inner surface of the hollow main body.

In some embodiments, the distance between the contacting member and the side wall is adjustable.

In some embodiments, the contacting member has a disc structure.

In some embodiments, the container energy storage system further comprises a plurality of wires, connecting the adjacent functional assemblies.

In some embodiments, the container energy storage system further comprises a busbar, connecting the functional assemblies and the splitting plate.

In some embodiments, the splitting plate further comprises an input unit, electrically connected to the functional assemblies.

In some embodiments, the splitting plate further comprises a display unit, electrically connected to the functional assemblies for displaying the data and condition of the functional assemblies.

In some embodiments, the functional assembly comprises an energy storage member, a power converter, a fire box, a switchboard, a transformer, or a system controller.

In some embodiments, the walls of the hollow main body have no hole.

In some embodiments, the container is an equivalent unit.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The making and using of the embodiments of the container energy storage system are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Unless defined otherwise, all technical and scientific terms used herein have the same meaning as commonly understood to one of ordinary skill in the art to which this invention belongs. It should be appreciated that each term, which is defined in a commonly used dictionary, should be interpreted as having a meaning conforming to the relative skills and the background or the context of the present disclosure, and should not be interpreted by an idealized or overly formal manner unless defined otherwise.

Figure 1A:
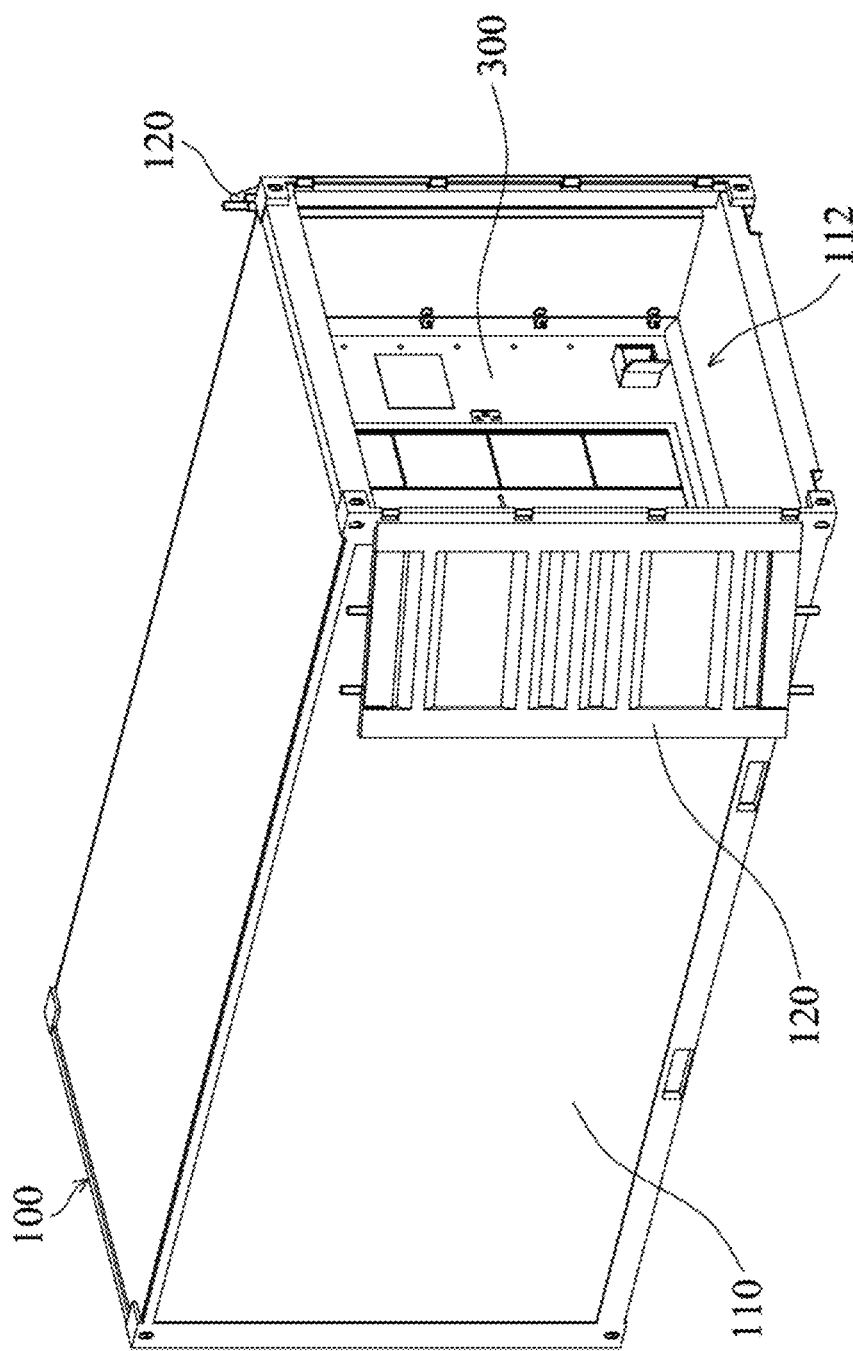
FIG. 1A is a schematic diagram of a container energy storage system according to an embodiment of the invention.
Figure 1B:
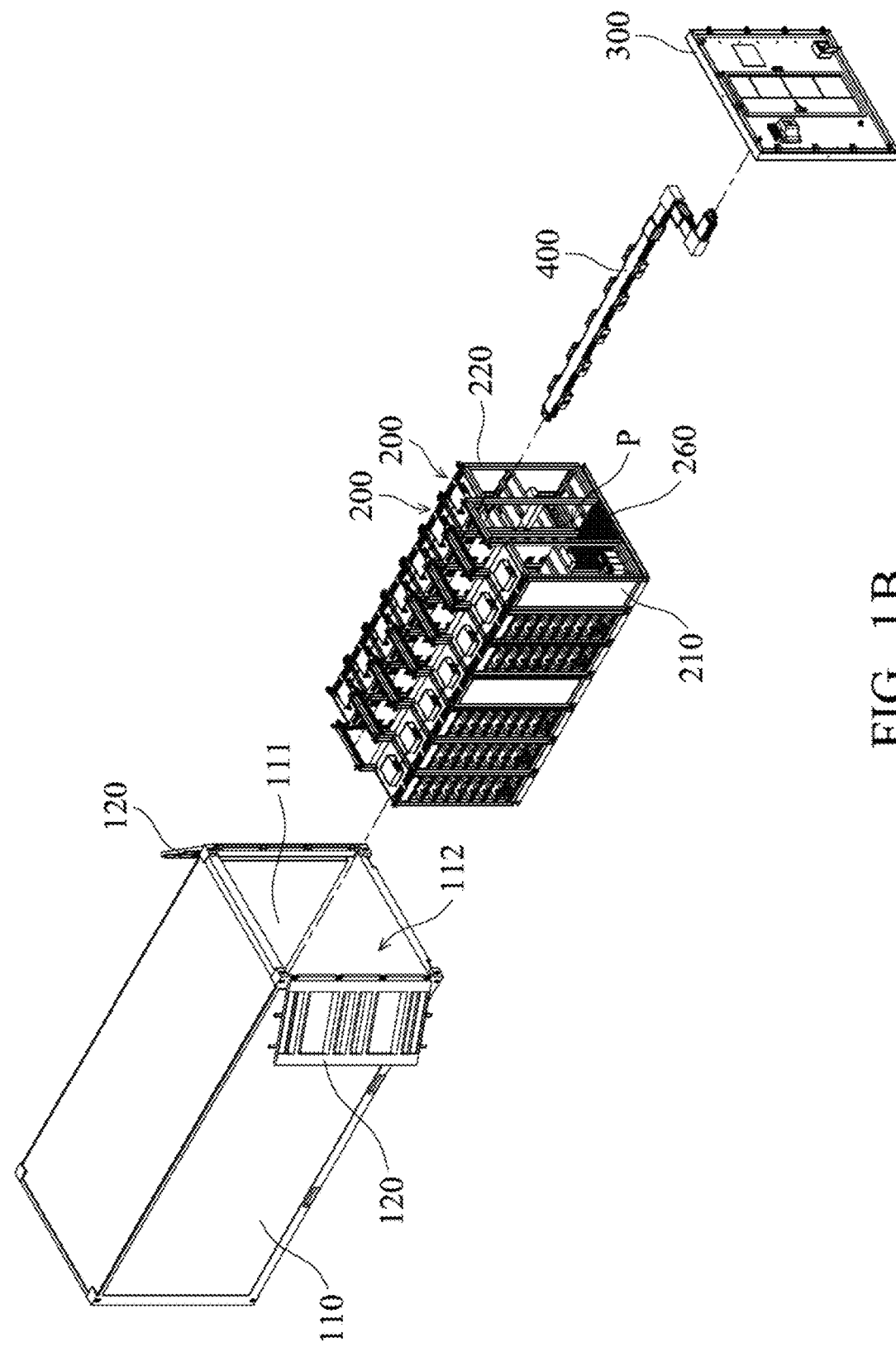
FIG. 1B is an exploded-view diagram of a container energy storage system according to an embodiment of the invention.
Figure 1C:
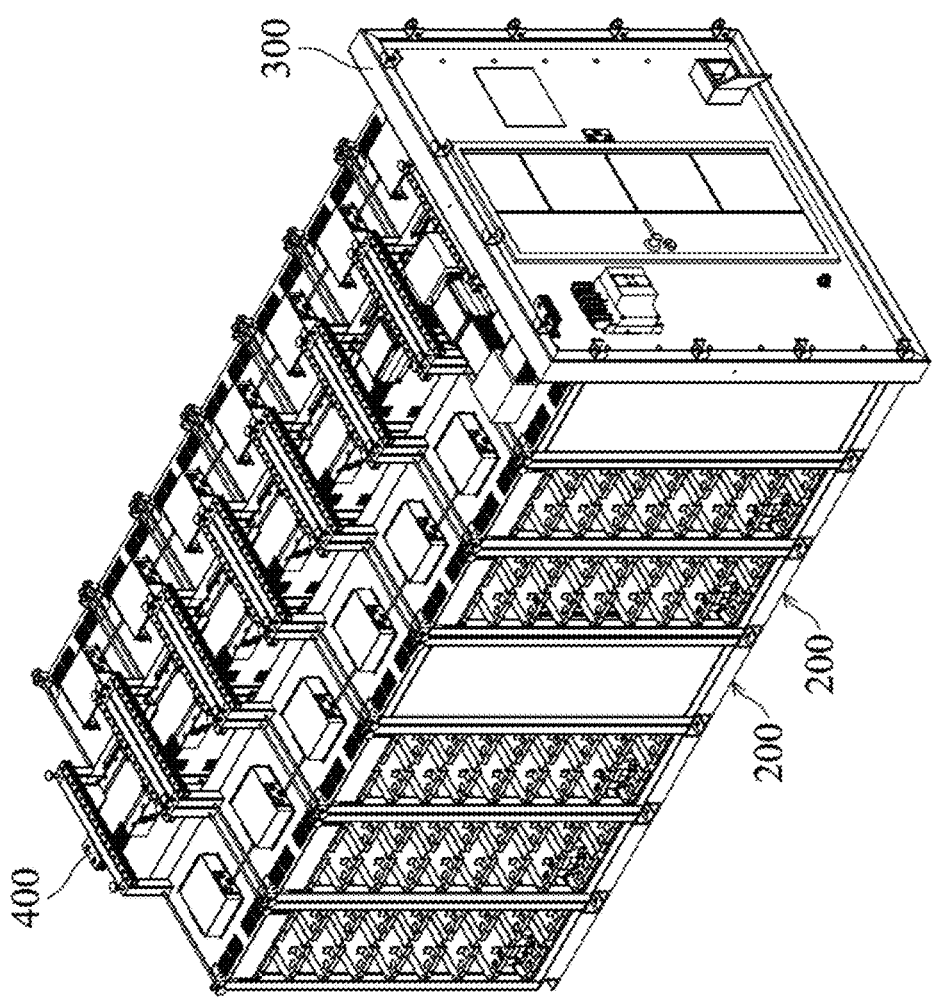
FIG. 1C is a schematic diagram of functional assemblies, a splitting plate, and a busbar according to an embodiment of the invention.

FIG. 1A is a schematic diagram of a container energy storage system according to an embodiment of the invention, FIG. 1B is an exploded-view diagram of the container energy storage system, and FIG. 1C is a schematic diagram of functional assemblies, a splitting plate, and a busbar. As shown in FIGS. 1A-1C, a container energy storage system primarily comprises a container 100, a plurality of functional assemblies 200, a splitting plate 300, and a busbar 400. The container 100 comprises a hollow main body 110 and two doors 120. The hollow main body 110 has a hollow cuboid structure, and an accommodating space 111 is formed therein. An opening 112 communicating with the accommodating space 111 is formed on an end of the hollow main body 110.

The functional assemblies 200, the splitting plate 300, and the busbar 400 are disposed in the accommodating space 111, and the splitting plate 300 is disposed between the opening 112 and the functional assemblies 200. The busbar 400 connects the functional assemblies 200 with the splitting plate 300, such that the power and the signal can be transmitted therebetween. Two doors 120 are pivotally connected to the hollow main body 110, such that the doors 120 can rotate relative to the hollow main body 110. When the doors 120 are in an open position relative to the hollow main body 110, the user can enter the accommodating space 111 through the opening 112 to operate, replace or maintain the functional assemblies 200 and the splitting plate 300. When the doors 120 are in the closed position relative to the hollow main body 110, the doors 120 can cover the opening 112.

It should be noted that, in this embodiment, the container 100 is an equivalent unit, such as a twenty-foot equivalent unit (TEU) or a forty-foot equivalent unit (FEU). The walls of the hollow main body 110 are made of a water-resistant material and have no hole formed by secondary processing. The waterproof tape (not shown) is further disposed in the connecting portion between the walls. Therefore, when the doors 120 are in the closed position, the container 100 can prevent water or foreign matter from entering the accommodating space 111, and breakage of the splitting plate 300 or the functional assemblies 200 can be avoided.

Figure 2A:
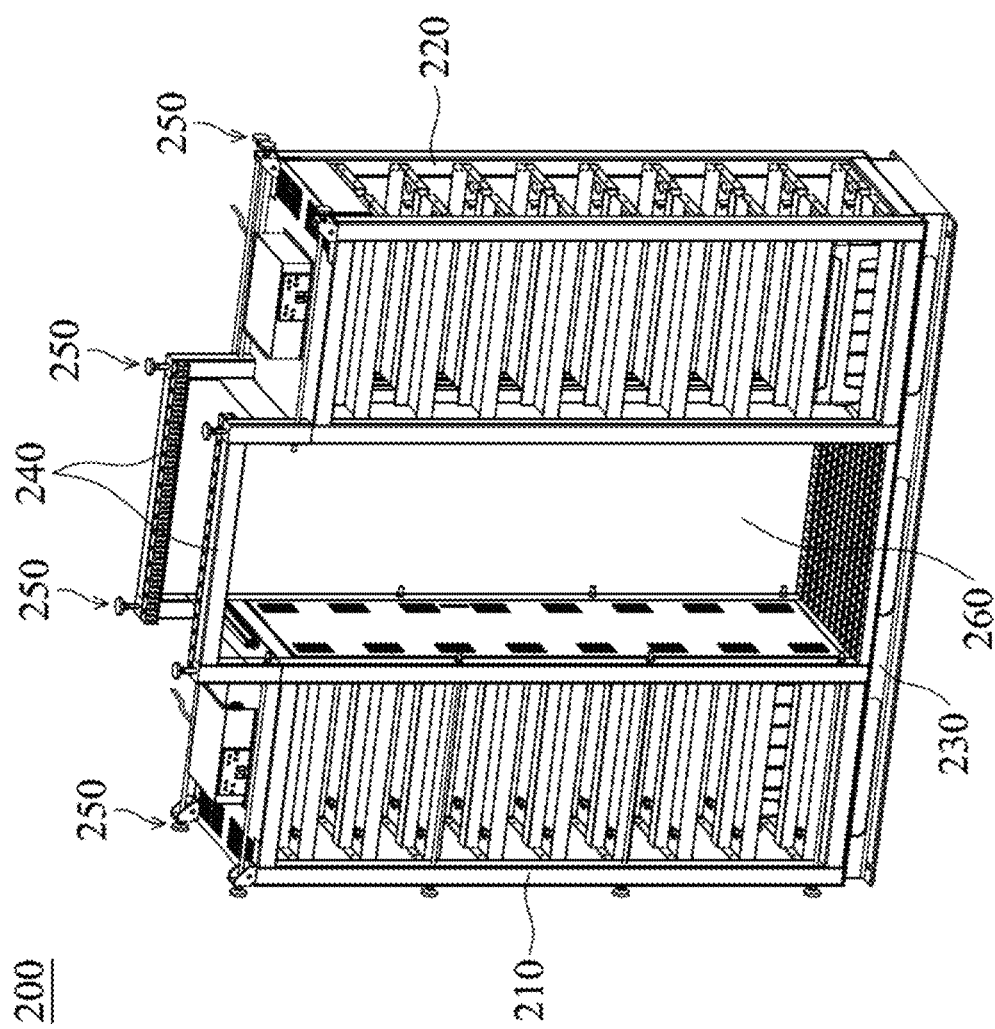
FIG. 2A is a schematic diagram of a functional assembly according to an embodiment of the invention.

Referring to FIG. 2A, in this embodiment, each of the functional assemblies 200 comprises a first rack 210, a second rack 220, a base 230, at least one connecting member 240, and at least one fixing mechanism 250. The first rack 210 and the second rack 220 are detachably disposed on the base 230, and situated at opposite sides of the base 230. Thus, a gap 260 can be formed between the first rack 210 and the second rack 220.

As shown in FIG. 1B, in this embodiment, the appearance of the functional assemblies 200 are substantially the same, and the functional assemblies 200 are parallel and aligned with each other when the functional assemblies 200 are disposed in the accommodating space 111 of the hollow main body 110. Thus, the gaps 260 of the functional assemblies 200 can be substantially aligned with each other and form a passage P. After the user enters the accommodating space 111 of the container 100, he can pass through the passage P and access the functional assembly 200 when it needs to be maintained or replaced.

Referring to FIG. 2A, the connecting member 240 connects the first rack 210 and the second rack 220 for preventing the first rack 210 and second rack 220 from sloping toward the gap 260. Furthermore, the busbar 400 can be fixed on the connecting member 240. In some embodiments, the busbar 400 can be directly attached on the inner surface of the hollow main body 110.

In this embodiment, the functional assembly 200 may comprise an energy storage member, a power converter, a fire box, a switchboard, a transformer, or a system controller. A plurality of electronic elements (not shown) can be disposed on the first and second racks 210, 220 corresponding to the different types of functional assembly 200. For example, when the functional assembly 200 is the energy storage member, the electronic elements can be the batteries or the power generators disposed on the first and second racks 210, 220. When the functional assembly 200 is the fire box, the electronic elements can be the smoke detectors or extinguishing units disposed on the first and second racks 210, 220.

Figure 2B:
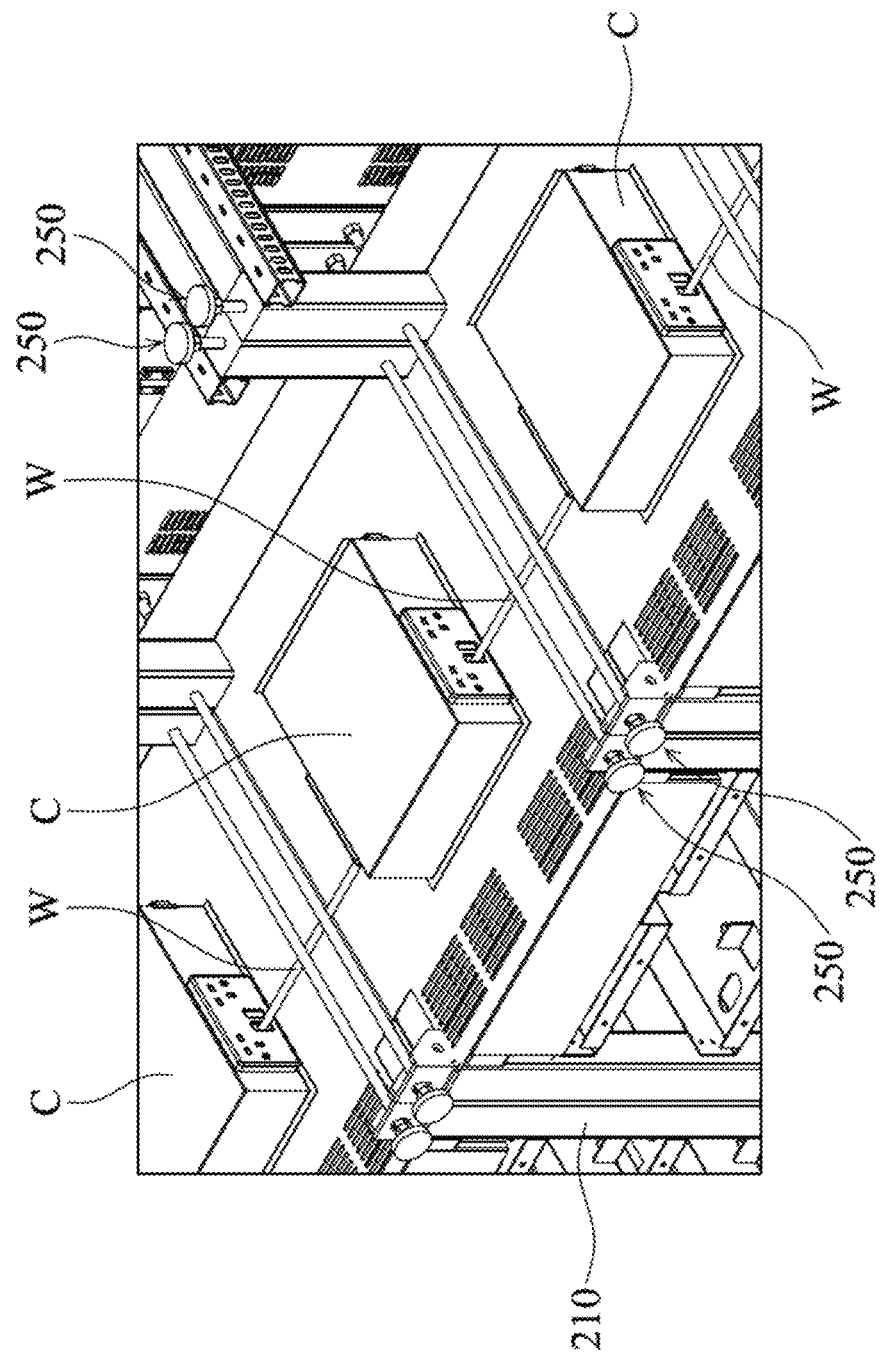
FIG. 2B is a schematic diagram of electronic connectors of the functional assemblies connected to each other according to an embodiment of the invention.

Referring to FIG. 2B, the first rack 210 and the second rack 220 of each of the functional assemblies 200 may each have an electronic connector C. The electronic connector C is electrically connected to the electronic elements in the functional assemblies 200, and connected to the adjacent electronic connector C by a wire W. Therefore, the power and the signal can be rapidly transmitted between the functional assemblies 200.

Figure 2C:
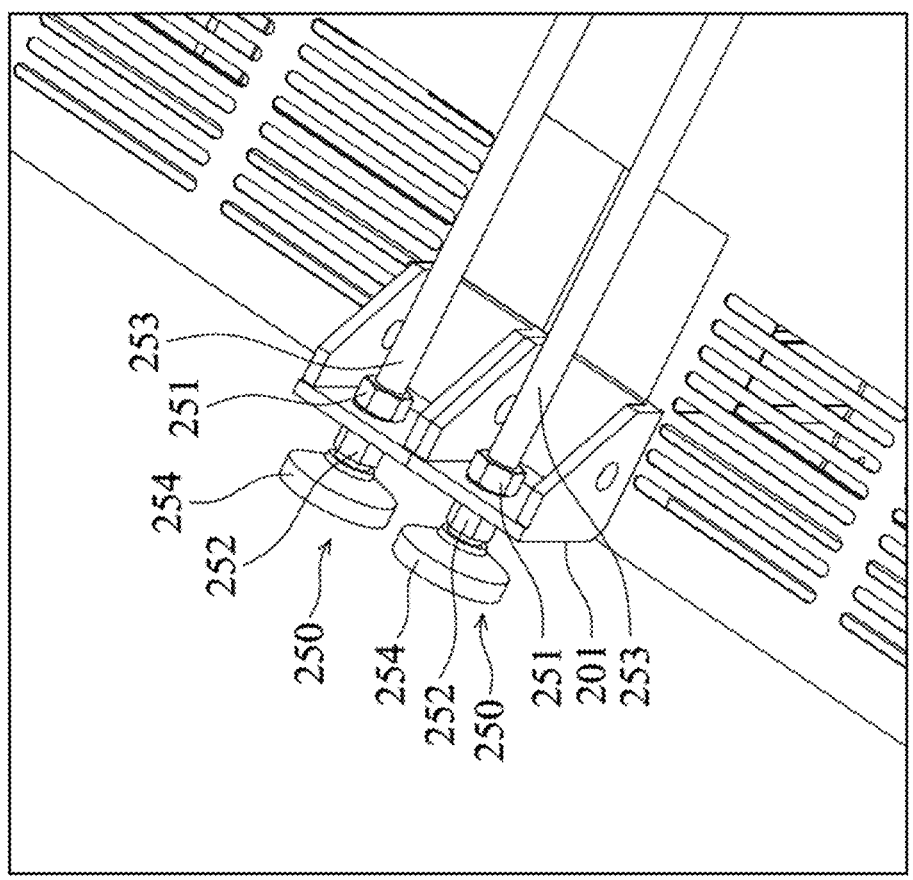
FIG. 2C is a schematic diagram of a fixing mechanism according to an embodiment of the invention.
Figure 2D:
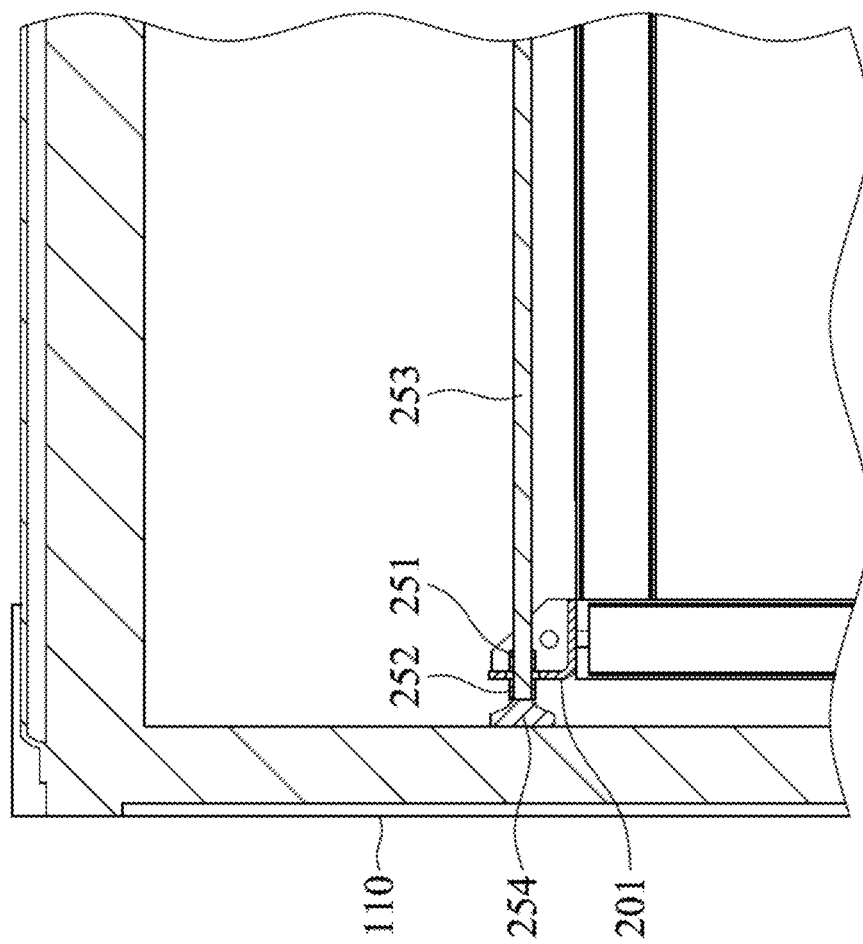
FIG. 2D is a schematic diagram of a contacting member contacted to an inner surface of a hollow main body according to an embodiment of the invention.

As shown in FIGS. 2A, 2C, and 2D, the fixing mechanism 250 of the functional assembly 200 comprises a first nut 251, a second nut 252, a pole 253, and a contacting member 254, wherein the screw thread is formed on the pole 253. The pole 253 can pass through the first nut 251, the side wall 201 of the functional assembly 200, and the second nut 252, and can be fixed on the functional assembly 200 by the first nut 251 and the second nut 252. The side wall 201 is situated between the first nut 251 and the second nut 252. The contacting member 254 has a disc structure, and connects an end of the pole 253.

When the functional assemblies 200 are disposed in the accommodating space 111 of the hollow main body 110, the contacting member 254 of the fixing mechanism 250 can contact the inner surface of the hollow main body 110 (FIG. 2D). In this embodiment, fixing mechanisms 250 are formed on the left side, right side, and top of the functional assembly 200 (FIG. 2A). Therefore, the functional assemblies 200 can be fixed in the accommodating space 110 by friction without breaking any walls of the container 100.

Specifically, because the contacting member 254 has a disc structure, the contacting area between the contacting member 254 and the hollow main body 110 can be increased. The functional assemblies 200 can be fixed steadily in the hollow main body 110. Furthermore, the normal container 100 has a wall with a corrugated structure. In this embodiment, the distance between the contacting member 254 and the side wall 201 of the functional assembly 200 is adjustable. Thus, no matter where the functional assembly 200 in the hollow main body 110 is, the contacting member 254 can contact the inner surface of the hollow main body 110.

In some embodiments, fixing mechanisms 250 merely disposed on the left side and right side of the functional assembly 200 (the fixing mechanism 250 on the top can be omitted). In some embodiments, the fixing mechanism 250 is merely disposed on the top of the functional assembly 200 (the fixing mechanisms 250 on the left side and right side can be omitted). In some embodiments, the fixing mechanism 250 is merely disposed on the left side or the right side of the functional assembly 200 (the fixing mechanisms 250 on the other side and top can be omitted), and the other side of the functional assembly 200 can be attached on the inner surface of the hollow main body 110.

Figure 3:
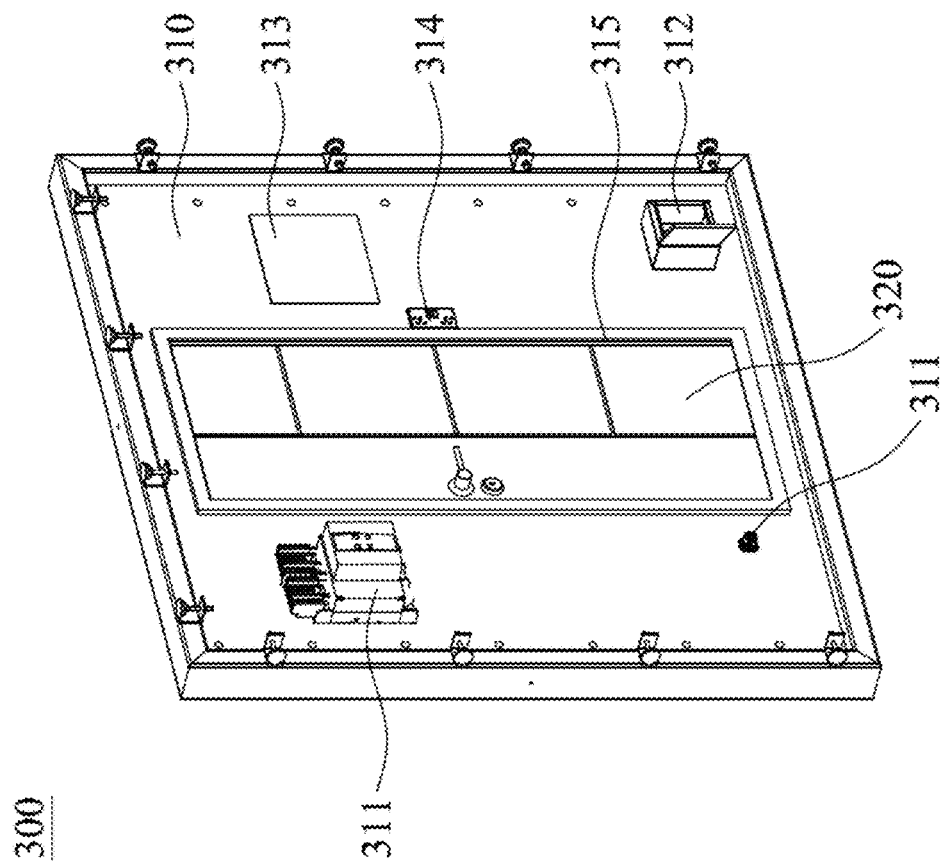
FIG. 3 is a schematic diagram of a splitting plate according to an embodiment of the invention.

Referring to FIG. 3, the splitting plate 300 electrically connected to the functional assemblies 200 comprises a board 310 and a hatch 320, wherein an entrance 315 is formed on the board 310 and corresponds to the passage P formed by the functional assemblies 200. The hatch 320 is pivotally connected to the board 310 for closing the entrance 315.

It should be noted that, in this embodiment, the dimensions of the cross section of the hollow main body 110 is substantially the same as the dimensions of the splitting plate 300. The splitting plate 300 comprises a water-resistant material, and the waterproof tape (not shown) is filled between the inner surface of the hollow main body 100 and the splitting plate 300. Thus, when the doors 120 are in the open position, the container energy storage system of the invention can still protect the functional assemblies 200 therein from the ingress of water and foreign matter.

Furthermore, in this embodiment, the splitting plate 300 is substantially parallel to the functional assemblies 200. When the doors 120 are in the closed position relative to the hollow main body 110, the splitting plate 300 is substantially parallel to the doors 120.

Figure 4:
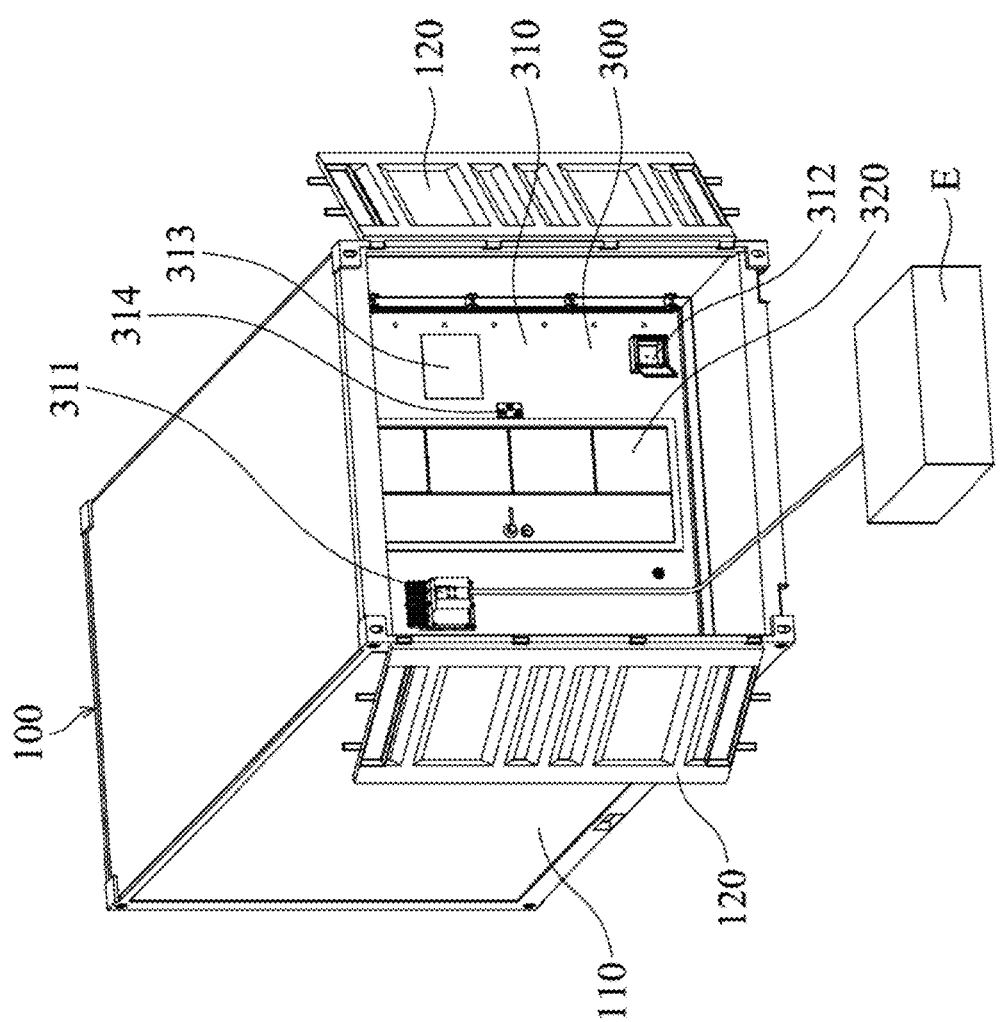
FIG. 4 is a schematic diagram of a container energy storage system connected to an electronic device according to an embodiment of the invention.

In this embodiment, the board 310 has at least one connecting port 311, at least one input unit 312, a display unit 313, and a lock unit 314. The connecting port 311 is used to connect the external electronic device E for providing the power thereto (as shown in FIG. 4). The input unit 312 is used to input the control signal, so that the user can change the parameters of the functional assemblies 200 without entering the passage P. The display unit 313 displays the data and condition of the functional assemblies 200. The lock unit 314 controls the hatch 320 to open or to close. In some embodiments, the display unit 313 can perform the functions of an input unit 312, such as a touch screen.

In summary, a container energy storage system is provided. The splitting plate is electrically connected to the functional assemblies and disposed between the opening and the functional assemblies, and the container energy storage system can provide power via the functional assemblies without breaking the walls of the container. Therefore, when the doors of the container are in the closed position, water and foreign matter cannot enter the interior of the container through the wall of the container.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, compositions of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. Moreover, the scope of the appended claims should be accorded the broadest interpretation so as to encompass all such modifications and similar arrangements.

While the invention has been described by way of example and in terms of preferred embodiment, it is to be understood that the invention is not limited thereto. On the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A container energy storage system, comprising:
   a container, comprising:
      a hollow main body having an opening; and
      two doors pivotally connected to the hollow main body;
   a plurality of functional assemblies disposed in the hollow main body, wherein each of the functional assemblies comprises a first rack, a second rack, and a base;
   a splitting plate, disposed between the functional assemblies and the opening, and having a connecting port electrically connected to each of the functional assemblies;
   wherein the first rack and the second rack are detachably disposed on the base and situated at opposite sides of the base, and
   wherein each of the first rack comprises a first electrical connector, the first electrical connector being directly connected to the first electrical connector of the first rack of at least one adjacent one of the functional assemblies by a first wire, and each of the second rack comprises a second electrical connector, the second electrical connector being directly connected to the second electrical connector of the second rack of the at least one adjacent one of the functional assemblies by a second wire.

2. The container energy storage system as claimed in claim 1, further comprising a gap formed between the first rack and the second rack.

3. The container energy storage system as claimed in claim 2, wherein the gap is formed as a passage, the splitting plate has an entrance, and the passage is aligned with the entrance.

4. The container energy storage system as claimed in claim 1, further comprising a connecting member connecting the first rack and the second rack.

5. The container energy storage system as claimed in claim 1, further comprising a busbar connecting each of the functional assemblies and the splitting plate.

6. The container energy storage system as claimed in claim 5, wherein the busbar is fixed on a connecting member connecting the first rack and the second rack.

7. The container energy storage system as claimed in claim 1, wherein each of the functional assemblies further comprises a plurality of fixing mechanisms contacting an inner surface of the hollow main body.

8. The container energy storage system as claimed in claim 7, wherein the fixing mechanisms are formed on at least two of a left side, a right side and a top of each of the functional assemblies.

9. The container energy storage system as claimed in claim 7, wherein each of the fixing mechanisms comprises:
 a first nut;
 a second nut;
 a pole having a screw thread, passing the first nut, a side wall of a respective one of the functional assemblies, and the second nut to be fixed on the respective one of the functional assemblies, wherein the side wall is situated between the first nut and the second nut; and
 a contacting member connected to an end of the pole, wherein, when the respective one of the functional assemblies is fixed in the hollow main body, the contacting member contacts the inner surface of the hollow main body.

10. The container energy storage system as claimed in claim 9, wherein a distance between the contacting member and the side wall is adjustable.

11. The container energy storage system as claimed in claim 10, wherein the contacting member has a disc structure.

12. The container energy storage system as claimed in claim 1, wherein, when the two doors are in a closed position, the two doors cover the opening.

13. The container energy storage system as claimed in claim 1, wherein the hollow main body has a cross section, and dimensions of the cross section of the hollow main body is substantially the same as that of the splitting plate.

14. The container energy storage system as claimed in claim 1, wherein the splitting plate further comprises an input unit electrically connected to each of the functional assemblies.

15. The container energy storage system as claimed in claim 1, wherein each of the functional assemblies comprises at least one of an energy storage member, a power converter, a fire box, a switchboard, a transformer, or a system controller.

16. The container energy storage system as claimed in claim 1, wherein the base extends from a far end of the first rack and to a far end of the second rack.

17. The container energy storage system as claimed in claim 1, wherein the base extends from a front end of the first rack to a back end of the first rack.

18. A container energy storage system, comprising:
 a container, comprising:
  a hollow main body having an opening; and
  two doors pivotally connected to the hollow main body;
 a plurality of functional assemblies disposed in the hollow main body, each of the functional assemblies comprising a first rack, a second rack, and a base;
 a splitting plate, disposed between the functional assemblies and the opening, having a connecting port electrically connected to each of the functional assemblies; and
 a busbar connecting each of the functional assemblies and the splitting plate, the busbar configured to transmit first power and at least one first signal between each of the functional assemblies and the splitting plate;
 wherein the first rack and the second rack are detachably disposed on the base and situated at opposite sides of the base, and
 wherein each of the first rack and the second rack comprises an electrical connector, the electrical connector being connected to an adjacent electrical connector of an adjacent one of the functional assemblies by a wire, the wire configured to rapidly transmit at least one of the first power or second power and at least one of the first signal or a second signal between the adjacent one of the functional assemblies and each of the first rack and the second rack.

19. The container energy storage system as claimed in claim 18, further comprising a gap formed between the first rack and the second rack and as a passage.

* * * * *